United States Patent
Haid et al.

[11] Patent Number: 6,055,614
[45] Date of Patent: *Apr. 25, 2000

[54] APPARATUS FOR PERFORMING A USER REQUESTED RESET DURING ALGORITHM EXECUTION

[75] Inventors: Christopher John Haid; Jeff Evertt, both of Folsom, Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/778,015

[22] Filed: Dec. 31, 1996

[51] Int. Cl.⁷ ...................................................... G06F 12/00

[52] U.S. Cl. ............................ 711/166; 711/103; 713/330

[58] Field of Search ........................... 365/185.11, 185.04, 365/185.29, 185.33, 185.22, 226, 218; 711/103, 166; 713/330, 340

[56] References Cited

U.S. PATENT DOCUMENTS

| | | | |
|---|---|---|---|
| 5,199,032 | 3/1993 | Sparks et al. | 371/3 |
| 5,353,256 | 10/1994 | Fandrich et al. | 365/185.11 |
| 5,396,639 | 3/1995 | Suenaga et al. | 395/800 |
| 5,509,134 | 4/1996 | Fandrich et al. | 711/103 |
| 5,594,686 | 1/1997 | Hazen et al. | 365/185.04 |
| 5,621,678 | 4/1997 | Doller | 365/185.29 |

*Primary Examiner*—Do Hyun Yoo
*Assistant Examiner*—Mehdi Namazi
*Attorney, Agent, or Firm*—Alex Witkowski

[57] ABSTRACT

A method and apparatus for reseting, for example, a Flash electrically erasable programmable read-only memory (EEPROM) having a microcontroller, the method and apparatus receiving a reset signal and, in response to said reset signal: determining if said microcontroller is performing an algorithm that manipulates a voltage and if said microcontroller is performing such an algorithm, performing a first operation to change the voltage, and performing a second operation to reset a logic.

12 Claims, 2 Drawing Sheets

APPARATUS FOR PERFORMING A USER REQUESTED RESET DURING ALGORITHM EXECUTION

BACKGROUND OF THE INVENTION

1. Field of the Invention

The present invention relates to the field of computer systems; more particularly, the present invention relates to a method and apparatus for performing an user-requested reset in a Flash electrically erasable programmable read-only memory (EEPROM).

2. Description of Related Art

Many Flash electrically erasable programmable read-only memories (EEPROMs) contain a control engine, such as a microcontroller, which performs many operations, for example program and erase algorithms, on the memory array. When the contents of a Flash EEPROM are being modified during a program or erase algorithm, the microcontroller typically manipulates relatively high voltages within the memory array.

When a user requested reset is received by the Flash EEPROM, an asynchronous reset is issued to the microcontroller. If the Flash EEPROM is performing a program or erase algorithm, the microcontroller aborts the algorithm in response to the asynchronous reset. Read operations performed after the reset is completed can cause reliability problems depending on the state of the high voltages at the time the algorithm was aborted.

What is needed is a method and apparatus to quickly respond to a user-requested reset in a FLASH EEPROM without causing reliability problems.

SUMMARY OF THE INVENTION

A method and apparatus for reseting a memory having a control engine that controls operations performed on a memory array, the method and apparatus receiving a reset signal and, in response to said reset signal: determining if the control engine is performing an algorithm that manipulates a relatively high voltage and if the control engine is performing such an algorithm, performing a first operation to change the voltage, and performing a second operation to reset a logic.

DETAILED DESCRIPTION

The present invention is a method and apparatus to perform a user-requested reset in a Flash electrically erasable programmable read-only memory (EEPROM). When a user-requested reset is received while the contents of the Flash EEPROM are being modified by manipulating relatively high voltages, these voltages are reduced in a controlled manner to a lower voltage before performing a reset in order to avoid damaging internal devices by operating at an unsafe voltage level. When a user-requested reset is received while the Flash EEPROM is not being modified by manipulating relatively high voltages, the Flash EEPROM is reset asynchronously. It will be apparent to one skilled in the art that the value of the relatively high voltage is not meant to denote a particular voltage, but rather that some algorithms are performed at a higher voltage than other operations.

Figure 1:
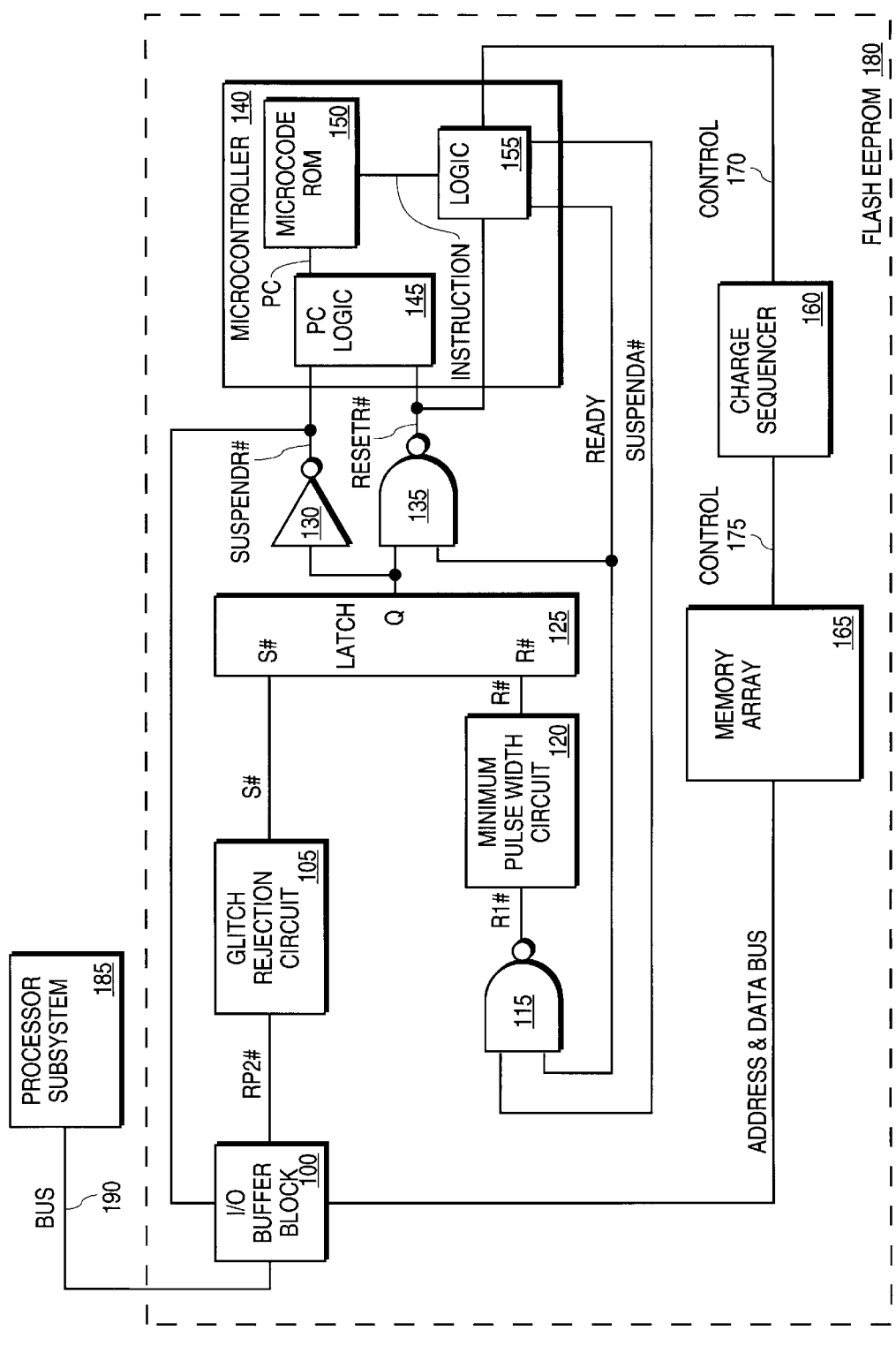
FIG. 1 illustrates one embodiment of the apparatus of the present invention for performing a user-requested reset in a memory.

FIG. 1 illustrates one embodiment of the apparatus of the present invention. The apparatus responds to an assertion of a reset request (RP#) signal differently depending on the state of a microcontroller 140. A ready signal is used to indicate that the microcontroller 140 is performing an algorithm. A suspend active (suspenda#) signal is driven low when the microcontroller is in a suspend state. In one embodiment, the microcontroller remains in the suspend state until a resume request is received.

When the microcontroller is not performing an algorithm (ready asserted) and is not performing an algorithm (suspenda# asserted), a resetr# signal is asynchronously asserted in response to the assertion of the RP# signal to reset the microcontroller and other devices of the apparatus. When the microcontroller is performing an algorithm, for example, a suspendr# signal is asserted to request that the microcontroller to execute a microcode sequence that modifies the relatively high voltage to a more safe level for subsequent operations. When the microcontroller has completed that microcode sequence, the resetr# signal is asserted to reset the microcontroller and other devices of the apparatus.

In the preferred embodiment, the apparatus is a Flash electrically erasable programmable read-only memory (EEPROM) 180 including an input/output (I/O) buffer block 100 coupled to receive and transmit signals on a bus 190. One of the signals received on the bus 190 is an reset/powerdown (RP#) signal which indicates a reset request when it is at a low level. Other signals, such as address, control, and data signals, may be received and/or generated by the I/O buffer block 100 on the bus 190. The I/O buffer block 100 generates an active low RP2# signal in response to the reset request. In other embodiments, a reset request is indicated by an edge of the RP# signal. The I/O buffer block may receive and/or generate other internal signals in the Flash EEPROM 180.

A glitch rejection circuit 105 is coupled to receive the RP2# signal and generates an S# signal which is responsive to assertions of the RP2# signal that are at least a specified duration. The glitch rejection circuit filters assertions of the RP2# signal that are less than the specified duration so that spurious reset operations are not performed. In one embodiment, the glitch rejection circuit comprises a logical NAND gate coupled to receive an inverted RP2# (RP2) signal, and a delayed RP2 signal such that the output of the logical NAND gate is only asserted when the RP2 signal is currently asserted and the RP2 signal was asserted at a time prior by the duration of the delay. In one embodiment, this delay is 2–3 nanoseconds, but it will be apparent to one skilled in the art that other delays may be employed. Alternatively, other implementations of the glitch rejection circuit 105 may be used as is well-known in the art. In alternative embodiments, the glitch rejection circuit 105 is not used and the RP2# signal is used directly as the S# signal. The S# signal is used to set the active low S# input of a latch 125.

A ready signal is used to indicate that the microcontroller 140 is not performing an algorithm. A suspend active (suspenda#) signal is driven low when the microcontroller is in a suspend state. A logical NAND gate 115 is coupled to receive the suspenda# signal and the ready signal to generate an R1# signal.

If the user deasserts the RP# signal while the microcontroller 140 is executing a suspend operation, the S# signal is deasserted but the microcontroller 140 continues to perform the suspend operation. The resetr# signal is not asserted until the microcontroller 140 is no longer active (ready asserted). When the suspend operation is completed (suspenda# deasserted) and the microcontroller is no longer active (ready asserted), the R# signal is asserted. The pulse width of the resetr# signal is the time between the assertion of the ready signal and the assertion of the R# signal (in response to the assertion of the ready signal). In order to guarantee that this pulse width is sufficient to properly reset the Flash EEPROM 180, a minimum pulse width circuit 120 is used to delay the assertion of the R# signal.

The minimum pulse width circuit 120 is coupled to receive the R1# signal to generate an R# signal. The minimum pulse width circuit 120 responds to assertions of the R1# signal that are shorter than the minimum pulse width to assert the R# signal for a duration that is at least as long as the minimum pulse width. In one embodiment, an or gate is coupled to receive the R1# signal and a delayed R1# signal to generate the R# signal. In one embodiment, this delay is 4–5 nanoseconds, but it will be apparent to one skilled in the art that other delays may be employed. Alternatively, other implementations of the minimum pulse width circuit 120 may be used as is well-known in the art. In alternative embodiments, the minimum pulse width circuit 120 is not used and the R1# signal is used directly as the R# signal. The R# signal is used to reset the active-low R input of a latch 125.

The latch 125 generates a state signal (Q) in response to the S# signal and the R# signal as is well-known in the art. Preferably, an assertion of the S# signal has priority over the R# signal. When the microcontroller is inactive (ready asserted) and the microcontroller is not in a suspend state (suspenda# asserted), the R# signal is asserted but an assertion of the RP# signal causes the Q signal to be asserted asynchronously due to the priority of the S# signal. An inverter 130 is coupled to receive the state signal and generate a suspendr# signal. A logical NAND gate 135 is coupled to receive the state signal and a ready signal to generate a resetr# signal.

When the microcontroller is ready to accept a reset request as indicated by the ready signal, the resetr# signal is asserted asynchronously in response to a reset request. This causes the microcontroller to be reset regardless of the state of the suspenda# signal. When the microcontroller is not ready to accept a reset request as indicated by the ready signal, the resetr# signal is not asserted asynchronously. The suspendr# signal is issued to the microcontroller 140 to initiate a suspend operation in response to the reset request. Preferably, the suspendr# signal is coupled to a program counter (PC) logic 145 which issues a PC signal corresponding to the suspend sequence. A microcode read-only memory (ROM) 150 is coupled to receive the PC signal and issue suspend sequence instructions (e.g., microcode) to a logic 155 via the instruction bus. The logic 155 is coupled to drive a control bus 170 according to the suspend sequence instructions. A charge sequencer 160 is coupled to control the voltage of nodes within a memory array 165 via control bus 175 according to the control signal received on the control bus 170. When the suspend operation is completed, the ready signal is asserted thereby enabling the assertion of the resetr# signal.

Preferably, the suspendr# signal is also coupled to the I/O buffers 100 to disable all the I/O buffers 100 except the input buffer corresponding to the RP# signal. In particular, the chip enable# (CE#) input buffer is disabled such that the device does not respond to (locks out) assertions of the CE# signal. By disabling the I/O buffers 100 in this manner, the apparatus external emulates the reset operation even though the reset operation has been delayed while the suspend operation is being performed. This permits conditionally delaying the requested reset operation to be transparent (except for the additional latency) to the system which has asserted the RP# signal.

FIG. 1 also shows one embodiment of a system of the present invention. A processor subsystem 185 is coupled to drive the bus 190 which includes address and data bus signals. The address and data signals are coupled internally to the memory array 165 to perform read and write operations. Preferably, the processor subsystem 185 includes a processor and a memory controller. It will be apparent to one skilled in the art that the processor subsystem 185 may include any device which may interface with a flash EEPROM.

It will be apparent to one skilled in the art that other signals and devices are necessary or desirable for the operation of the Flash EEPROM 180 but are not described herein in order to avoid obscuring the present invention. For example, the Flash EEPROM may include a command user-interface (CUI) device which receives commands from the processor subsystem 185, for example, and issues commands to the microcontroller 140.

Figure 2:
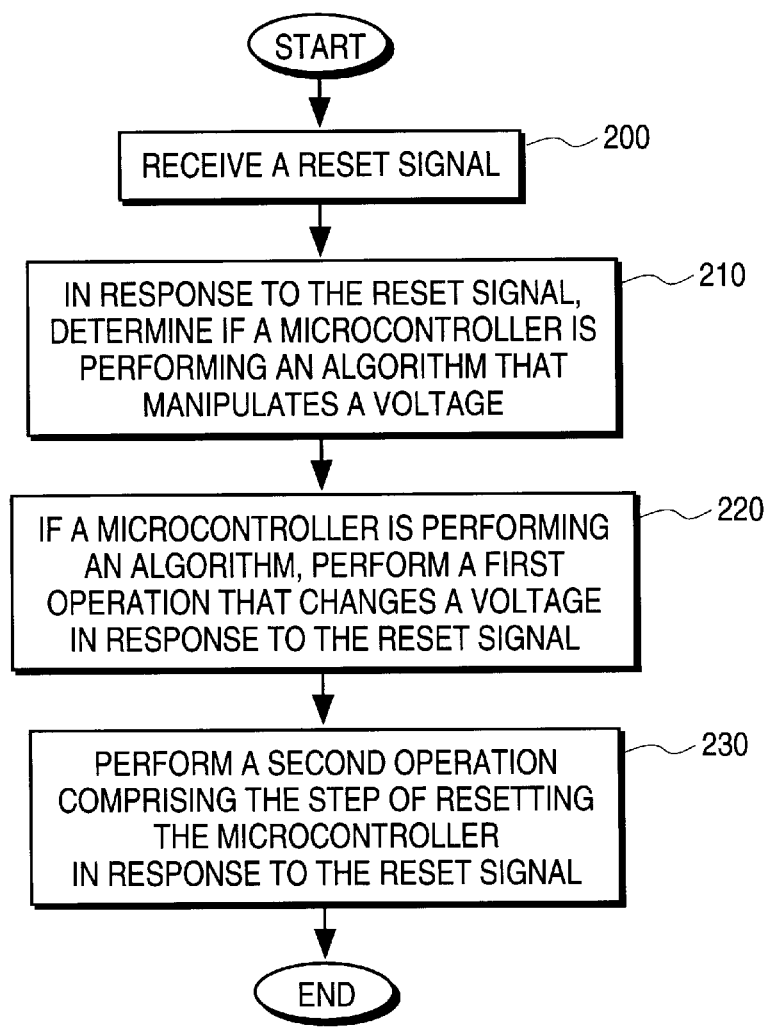
FIG. 2 illustrates one embodiment of the method of the present invention for performing a user-requested reset in a memory.

FIG. 2 illustrates the method of the present invention.

In step 200, a reset request is received. It will be apparent to one skilled in the art that numerous methods of requesting a reset may be used. In one embodiment, a reset request is indicated by asserting a reset request signal for a minimum duration. Alternatively, the reset request is indicated by a falling edge or rising edge of the reset request signal.

In step 210, in response to the reset signal, determining if a microcontroller is performing an algorithm including the step of manipulating a voltage. Subsequent operations may cause reliability problems, for example, if they are performed at the higher voltages that may exist if the algorithm is aborted without restoring the voltages to safer levels for those operations.

In step 220, in response to the reset signal, if the microcontroller is performing the algorithm, a first operation comprising the step of changing the voltage to a safer level for subsequent operations is performed. In one embodiment, the first operation further comprises the step of disabling I/O buffers in order to externally emulate the reset operation as previously described.

In step 230, in response to the reset signal, a second operation comprising the step of reseting the microcontroller is performed. In other embodiments, other devices may be reset in response to the reset signal.

What is claimed is:

1. An apparatus for resetting a memory having a microcontroller, said apparatus comprising a logic coupled to receive a first signal and a second signal, said first signal indicating that a reset is requested, said second signal indicating whether a voltage exceeds a first value, said logic configured to generate a third signal in response to said first signal if said voltage does not exceed said first value, said logic configured to generate a fourth signal in response to said first signal and to generate said third signal after a delay if said voltage exceeds said first value, said third signal initiating a reset operation, said fourth signal initiating a process of reducing said voltage.

2. The apparatus of claim 1 wherein said logic comprises:

a latch coupled to receive said first signal and said second signal to generate a state signal;

a first logic configured to generate said fourth signal in response to said state signal; and a second logic configured to generate said third signal in response to said state signal and a fifth signal, said fifth signal indicating that said microcontroller is ready to accept said fifth signal.

3. The apparatus of claim 2 wherein said logic comprises:

a third logic configured to generate said second signal in response to a sixth signal, said sixth signal indicating that said voltage does not exceed said first value.

4. The apparatus of claim 2 wherein said logic comprises a first circuit coupled to receive said first signal and configured to generate a sixth signal, said sixth signal responding to said first signal when said first signal is asserted for at least a certain period, said latch configured to be responsive to said sixth signal.

5. The apparatus of claim 1 wherein said logic comprises a second circuit coupled to receive said second signal and configured to generate a sixth signal having a minimum pulse width in response to said second signal, said latch configured to be responsive to said sixth signal.

6. A system for resetting a memory having a microcontroller, said system comprising:

a processor subsystem;

a logic coupled to receive a first signal from said processor subsystem and a second signal from said microcontroller, said first signal indicating that a reset is requested, said second signal indicating whether a voltage exceeds a first value, said logic configured to generate a third signal in response to said first signal if said voltage exceeds said first value, said logic configured to generate a fourth signal in response to said first signal and to generate said third signal after a delay if said voltage exceeds said first value, said third signal initiating a reset operation, said fourth signal initiating a process of reducing said voltage.

7. The system of claim 6 wherein said logic comprises:

a latch coupled to receive said first signal and said second signal configured to generate a state signal;

a first logic configured to generate said fourth signal in response to said state signal; and a second logic configured to generate said third signal in response to said state signal and a fifth signal, said fifth signal indicating that said microcontroller is ready to accept said fifth signal.

8. The system of claim 7 wherein said logic comprises:

a third logic configured to generate said second signal in response to a sixth signal, said sixth signal indicating that said voltage exceeds said first value.

9. The system of claim 7 wherein said logic comprises a first circuit coupled to receive said first signal and configured to generate a sixth signal, said sixth signal responding to said first signal when said first signal is asserted for at least a certain period, said latch configured to be responsive to said sixth signal.

10. The system of claim 7 wherein said logic comprises a second circuit coupled to receive said second signal and configured to generate a sixth signal having a minimum pulse width in response to said second signal, said latch configured to be responsive to said sixth signal.

11. The system of claim 7 wherein said logic comprises a second circuit coupled to receive said second signal and configured to generate a sixth signal having a minimum pulse width in response to said second signal, said latch configured to be responsive to said sixth signal.

12. The system of claim 6 wherein said microcontroller comprises said logic.

\* \* \* \* \*